United States Patent
Lennevi et al.

(10) Patent No.: US 9,766,298 B2
(45) Date of Patent: Sep. 19, 2017

(54) METHOD FOR ESTIMATING STATE OF HEALTH OF A BATTERY IN A HYBRID VEHICLE

(71) Applicant: VOLVO TRUCK CORPORATION, Göteborg (SE)

(72) Inventors: Jerker Lennevi, Lerum (SE); Tommy Hjelle, Torslanda (SE); Tobias Smidebrant, Göteborg (SE); Niklas Legnedahl, Onsala (SE); Johanna Gustafsson, Vasteras (SE); Hanna Bryngelsson, Göteborg (SE)

(73) Assignee: Volvo Truck Corporation, Göteborg (SE)

( * ) Notice: Subject to any disclaimer, the term of this patent is extended or adjusted under 35 U.S.C. 154(b) by 90 days.

(21) Appl. No.: 14/898,296

(22) PCT Filed: May 23, 2014

(86) PCT No.: PCT/EP2014/001393
§ 371 (c)(1),
(2) Date: Dec. 14, 2015

(87) PCT Pub. No.: WO2014/202172
PCT Pub. Date: Dec. 24, 2014

(65) Prior Publication Data
US 2016/0146898 A1 May 26, 2016

Related U.S. Application Data

(60) Provisional application No. 61/836,704, filed on Jun. 19, 2013.

(51) Int. Cl.
*G01N 27/416* (2006.01)
*H02J 7/00* (2006.01)
(Continued)

(52) U.S. Cl.
CPC ............ *G01R 31/3679* (2013.01); *B60L 3/12* (2013.01); *B60L 11/1857* (2013.01);
(Continued)

(58) Field of Classification Search
CPC .................................................. G01R 31/3679
(Continued)

(56) References Cited

U.S. PATENT DOCUMENTS

| 2011/0060538 | A1 | 3/2011 | Fahimi et al. | |
| 2012/0256599 | A1* | 10/2012 | Gu | G01R 31/3679 320/149 |
| 2012/0310565 | A1* | 12/2012 | Redey | G01R 31/3631 702/63 |

FOREIGN PATENT DOCUMENTS

| EP | 1918729 A1 | 5/2008 |
| WO | 2013053724 A2 | 4/2013 |

OTHER PUBLICATIONS

International Preliminary Report on Patentability (Oct. 26, 2015) for corresponding International App. PCT/EP2014/001393.
(Continued)

*Primary Examiner* — Edward Tso
*Assistant Examiner* — Ahmed Omar
(74) *Attorney, Agent, or Firm* — WRB-IP LLP

(57) ABSTRACT

A method for estimation of state-of-health (SOH) characteristics of a battery in hybrid vehicles includes charging and discharging the battery at least one time within an upper region of a state-of-charge (SOC) window, wherein the battery; charging and discharging the battery at least one time within a lower region of the SOC window, calibrating a battery management unit included in the hybrid vehicle by using the reached levels outside the SOC window, and estimating the SOH characteristics of the battery during the charge and discharge periods by using the battery management unit.

7 Claims, 3 Drawing Sheets

(51) Int. Cl.
 *G01R 31/36* (2006.01)
 *B60L 3/12* (2006.01)
 *B60L 11/18* (2006.01)
 *G01R 35/00* (2006.01)

(52) U.S. Cl.
 CPC ...... *B60L 11/1862* (2013.01); *G01R 31/3606* (2013.01); *G01R 35/005* (2013.01); *B60L 2240/547* (2013.01); *B60L 2240/80* (2013.01); *G01R 31/3627* (2013.01); *Y02T 10/705* (2013.01); *Y02T 10/7005* (2013.01); *Y02T 10/7044* (2013.01)

(58) Field of Classification Search
 USPC ........................................................ 324/426
 See application file for complete search history.

(56) References Cited

OTHER PUBLICATIONS

International Search Report (Mar. 3, 2015) for corresponding International App. PCT/EP2014/001393.

* cited by examiner

METHOD FOR ESTIMATING STATE OF HEALTH OF A BATTERY IN A HYBRID VEHICLE

BACKGROUND AND SUMMARY

This disclosure relates to a method for estimating State of health, SOH, of battery in a hybrid vehicle. Further this disclosure relates to hybrid vehicles with high power components (100 kW) where the power variations are large and fast. The disclosure is particularly advantageous in the field of electrical storage system for heavy vehicles, such as trucks, buses, construction vehicles, or the like.

Knowing the amount of energy left in a battery compared with the energy it had when it was full give the user an indication of how much longer a battery will continue to perform before it needs to recharge. This amount of energy is denoted State-of-Charge or SOC. SOC is the available capacity of a battery expressed as a percentage of its rated capacity. Batteries of hybrid vehicles have a voltage vs. State-of-charge characteristics, as shown by the voltage vs SOC curve in FIG. 1. The useful range denoted SOC window, of the battery is primarily in the "flatter" region of the characteristics.

The SOC window shows the available range of operation and it decreases from the ageing. An ageing battery changes its characteristics gradually so that it becomes more and more difficult to recharge. The characteristic alters slightly with aging which is shown in FIG. 1 and this alteration may be characterised in a parameter denoted State-of-Health or SOH. SOH is a measurement that reflects the general condition of a battery and its ability to deliver the specified performance compared with a new and fresh battery. The SOH parameter takes into account such factors as charge acceptance, internal resistance/impedance/conductance, capacity, electrical energy, self-discharge, ability to accept a charge and number of charge-discharge cycles. The consequence of attempting to charge a more and more aging battery is that the voltage increases at lower SOC level. This can lead to triggering of high voltage watchdogs and fault codes which can cause mission stop and/or be harmful to components in a hybrid vehicle. Therefore it is important to estimate the condition, SOH, of a battery and thus being able to gradually reduce the SOC window of the battery.

Unlike the SOC which can be determined by measuring the actual charge in the battery there is no absolute definition of SOH. SOH is a subjective measure in that different users derive the SOH from a variety of measurable battery performance parameters. SOH is a figure of merit of the condition of a battery (or a cell, or a battery pack), compared to its ideal conditions. The units of SOH are percent points where 100% corresponds to the battery condition matching the battery specifications. Typically, a battery SOH will be 100% at the time of manufacture and will decrease over time and use.

During normal operation it is difficult to estimate the SOH. If overestimated it may cause unnecessary watchdog fault triggers and mission stop, and if underestimated it may cause unnecessary loss of performance and premature scrapping of battery.

It is desirable to provide a method for estimation and calibration of State-of-health, SOH, of a battery in a hybrid vehicle, a method when the previously mentioned problems is at least partly avoided.

A method is provided according to an aspect of the present invention for estimation of State-of-Health, SOH, characteristics of a battery in a hybrid vehicle comprising a battery management unit, comprising the steps of:
  calibrating the battery management unit b determining the present state-of-charge (SOC) window of the battery, comprising the steps of:
  charging the battery while measuring the derivative of the open circuit voltage (OCV) with respect to the state-of-charge, dOCV/dSOC, continuously;
  determining the first SOC level when the dOCV/dSOC is more than two times higher than a minimum dOCV/dSOC;
  charging the battery by a first high charge current impulse during a predetermined time period;
  discharging the battery while measuring the derivative dOCV/dSOC continuously;
  determining the second SOC level when the derivative dOCV/dSOC is increasing;
  discharging the battery by a second high current impulse during a predetermined time period;
  determining the present SOC window of the battery by using the determined first and second SOC levels; and
  estimating the SOH characteristics of the battery by comparing the determined present SOC window with a standard SOC window.

In this context, the first SOC level is determined when the derivative dOCV/dSOC is more than two times higher than a minimum value of dOCV/dSOC, which minimum value occurs at the central plateau of the voltage vs SOC curve in FIG. 1. Similarly, the second SOC level is determined when the derivative dOCV/dSOC is increasing, i.e. becomes greater than the minimum value of dOCV/dSOC.

Both during charging and discharging steps, the battery is charged/discharged by a high current impulse. This current should be high relative to the capacity of the battery. In the field of battery charging, some battery charging constructions supply a relatively small magnitude current to the batteries, for example, a C/10 value where the symbol C is defined to be the one-hour capacity of a battery. Other battery charging constructions supply a significantly higher current to the batteries, such as, for example, a C value (C=1). In this context, a current impulse of C>1 would conventionally be considered to be high. When performing a discharge of the battery it is an advantage to use the internal combustion engine of the vehicle for achieving a sufficiently high current impulse.

As indicated above, the determined present SOC window is compared with a standard SOC window. The standard SOC window can, for instance, be a detected initial SOC window or a known original SOC window supplied by the manufacturer of the battery.

The invention, according to an aspect thereof, further relates to an alternative method for estimation of State-of-health (SOH) characteristics of a battery in hybrid vehicles, comprising the steps of:
  charging and discharging the battery at least one time within an upper region of a State-of-charge (SOC) window, wherein the battery:
  i) is charged to a first predetermined level in the upper region of the SOC window during a first time period;
  ii) is charged by a first charge current impulse for pushing the SOC level of the battery to a level above the first predetermined level, during a second time period;
  iii) is discharged by an electrical machine to a second predetermined level within the SOC window;
  charging and discharging the battery at least one time within a lower region of the SOC window wherein the battery:

i) is charged to a third predetermined level in the SOC window, during a third time v) period;
ii) is discharged by an electrical machine to a fourth predetermined level in the SOC window;
iii) is discharged by a second current impulse, for pushing the SOC level of the battery to a level below the fourth predetermined level, during a fourth time period;
calibrating a battery management unit comprised in the hybrid vehicle by using the reached levels outside the SOC window;
estimating the SOH characteristics of the battery during the charge and discharge periods by using the battery management unit,
wherein; the first and third time period is longer than the second and fourth time period respectively; and the first predetermined level represents a higher voltage, than the second predetermined level and the third predetermined level represents a higher voltage, than the fourth predetermined level.

According to an aspect of the invention the determined present SOC window is compared with a standard SOC window. The standard SOC window can, for instance, be a detected initial SOC window or a known original SOC window supplied by the manufacturer of the battery. The SOH characteristics of the battery can then be estimated by the outcome of the comparison between the determined present SOC window and the standard SOC window.

As SOH does not correspond to a particular physical quality, there is no consensus in the industry on how SOH should be determined. In the art it is known that the battery management unit may use any of the following parameters (singly or in combination) in combination with the inventive parameter to derive an estimated value for the SOH:
Internal resistance/impedance/conductance
Capacity
Electrical energy
Self-discharge
Ability to accept a charge
Number of charge-discharge cycles In addition, the battery management unit can define an arbitrary weight for each parameter depending on its contribution to the SOH value. By comparing one or more such measured (and possibly weighted) parameters and the determined SOC window with stored parameters and a known original SOC window the SOH characteristics of the battery can be estimated. The inclusion of one or more additional, known parameters can provide a more accurate estimate of the current state of health of the battery.

Some embodiments of the invention provide for a method for an improved estimation of the State-of-health of a battery.

BRIEF DESCRIPTION OF THE DRAWINGS

Further objects, features and advantages of the present invention will appear from the following detailed description of the invention, wherein embodiments of the invention will be described in more detail with reference to the accompanying drawings, in which.

DETAILED DESCRIPTION

Various aspects of the disclosure will hereinafter be described more fully hereinafter with reference to the accompanying drawings, in which embodiments of the invention are shown.

This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference signs refer to like elements throughout.

During the life time of a battery, its condition and performance, health, tends to deteriorate gradually due to irreversible physical and chemical change which take place with usage and with age until eventually the battery is not usable or dead. The SOH is an indication of the point which has been reached in the life cycle of the battery and a measure of the present condition relative to a new and fresh battery. Its purpose is to provide an indication of the performance which can be expected from the battery in its present condition or to provide an indication of how much of the useful lifetime of the battery has been consumed and how much remains before it must be replaced. Since the batteries of hybrid vehicle are rather expensive it is important to make an as correct as possible estimation of the SOH of the battery. The method according to the present invention enhances the precision of the SOH estimation.

Any parameter which changes, such as cell impedance or conductance, significantly with age may be used as a basis for providing an indication of the SOH of the battery. Since the SOH indication is relative to the condition of a new battery, a battery management unit, BMU, is configured to hold a record of the initial conditions and provide an estimate of the current/actual SOH. The BMU may be positioned within the hybrid vehicle or as an external measuring device, such an external charge-pole or charging station.

To be able to provide a precise estimation as possible the BMU has to be calibrated before making this estimation. Since the SOC window is rather easy to measure and indicates the aging of the battery the EMU is calibrated by determining the present SOC window before starting SOH estimation procedure.

Figure 1:
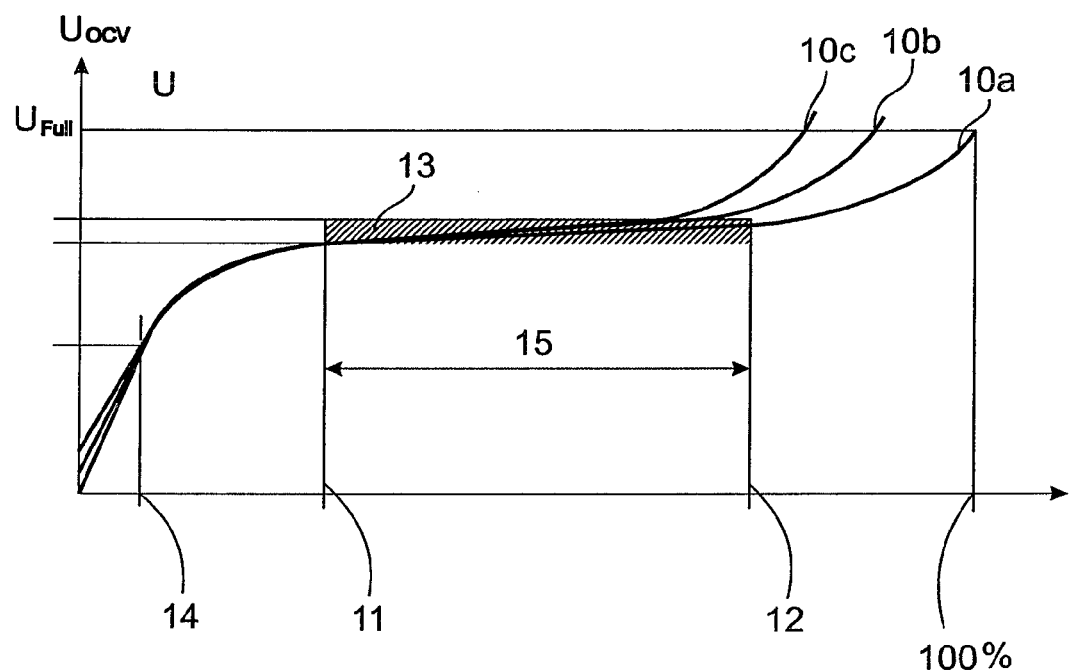
FIG. 1 shows a graph of output open circuit voltage as a function of the state of charge of a typical battery of a hybrid vehicle

FIG. 1 shows a graph of the output open circuit voltage, OCV, as a function of the State-of-charge, SOC, of a typical battery, which graph is also commonly referred to as voltage discharge curve. It is a stated goal of battery design to provide an output open circuit voltage, OCV, as constant as possible for a large interval of SOC. For this reason, a major portion of the discharge curve 10a, 10b, 10c in FIG. 1 is almost flat, i.e. the derivative dOCV/dSOC (slope) is very small. The intermediate interval 15 between a first SOC level 11 and a second SOC level 12 is called the SOC window 13. In the SOC window 13, a change in SOC level corresponds to a very small, sometimes hardly measurable, change in battery OCV. Such a low measurement resolution of the SOC renders accurate estimation of SOH of the battery difficult. The shape of the voltage discharge curve is influenced by aging, thus the SOC level corresponding to the first SOC level 11 and the second SOC level 12 may vary to a certain extent between different measurement occasions.

SOC is normally stated in percentage (%), where 0% corresponds to the battery containing no charge at all and the 100% corresponds to a battery completely full of charge.

There are several methods of estimating the SOC of a battery. Some are specific to particular cell chemistries and some depend on measuring some convenient parameter which varies with the SOC.

One common method for determining battery SOC is by measuring OCV of the battery. The OCV of a battery is determined by measuring the output open circuit voltage of the battery when the battery is disconnected from any external load and no external electric current flows through the battery. The OCV is in direct correlation with the SOC of the battery. Battery OCV is however disturbed by charging and discharging periods during driving for example a hybrid electric truck in a city.

The SOH estimation process according to the disclosure may advantageously be initiated first after the battery has rested a certain time period and the OCV of the battery has been registered. Battery SOC may be estimated using coulomb counting during charging and discharging.

Before being able to make SOH estimation, the present operating region, SOC window, has to be determined. The battery management unit, BMU, has to be calibrated with the correct SOC window. This is performed by means of stressing the battery at the edges of the operating region, SOC window, under well-defined operating conditions, to find out where the correct upper and lower edges of the SOC window are. Thus find out where the derivative dOCV/dSOC is considerably higher, which means that even a small difference in battery SOC provides a measurable difference in output open circuit voltage.

The battery is stressed by means of giving stimuli in the form of charge and discharge current pulses. This procedure is performed at standstill and with a disengaged driveline, equal to 5 neutral gear. A charge pulse is created by means of the diesel engine powering the electric motor in generative operation. A discharge pulse is created by the electric motor in monitoring operation driving the diesel engine which acts as brake by its friction and/or C engine retarder. The pulses are used to charge/discharge the battery somewhat outside the SOC window, and the response is collected and studied by the battery management unit, 10 BMU, to judge the SOH of the battery.

Figure 2:
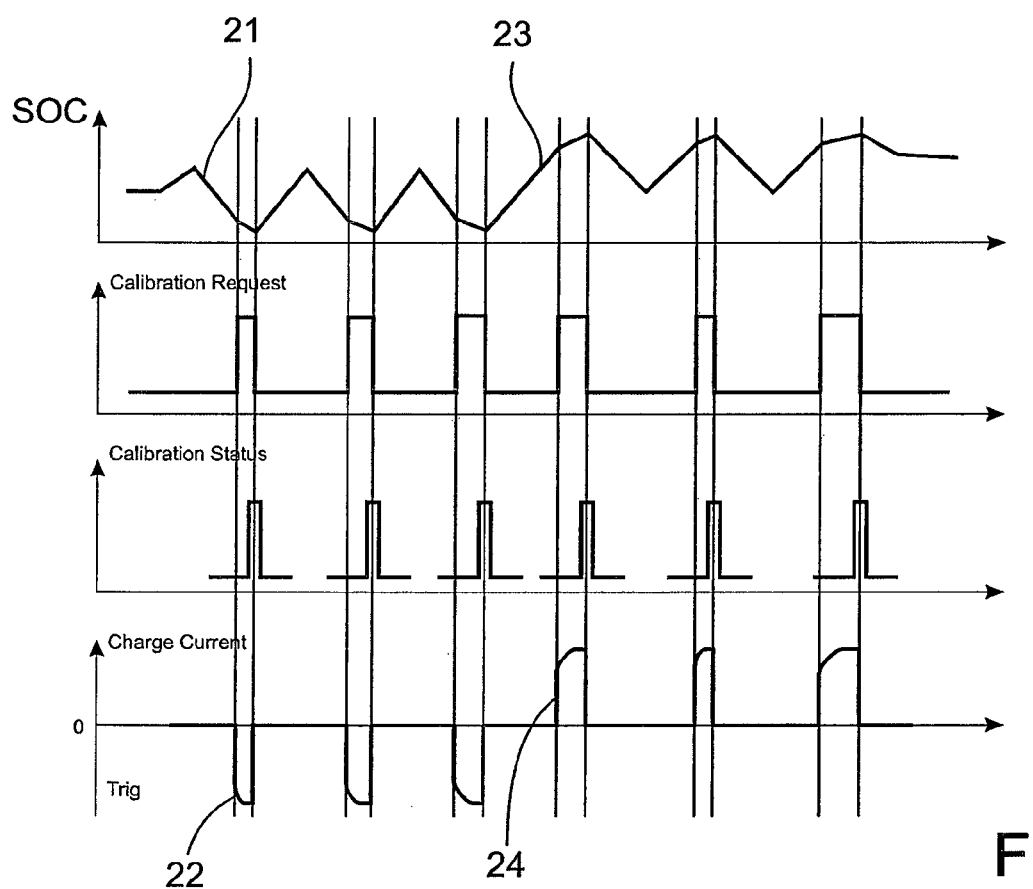
FIG. 2 shows exemplary graphs for carrying out the discharge and recharge step of the method according to the disclosure
Figure 3:
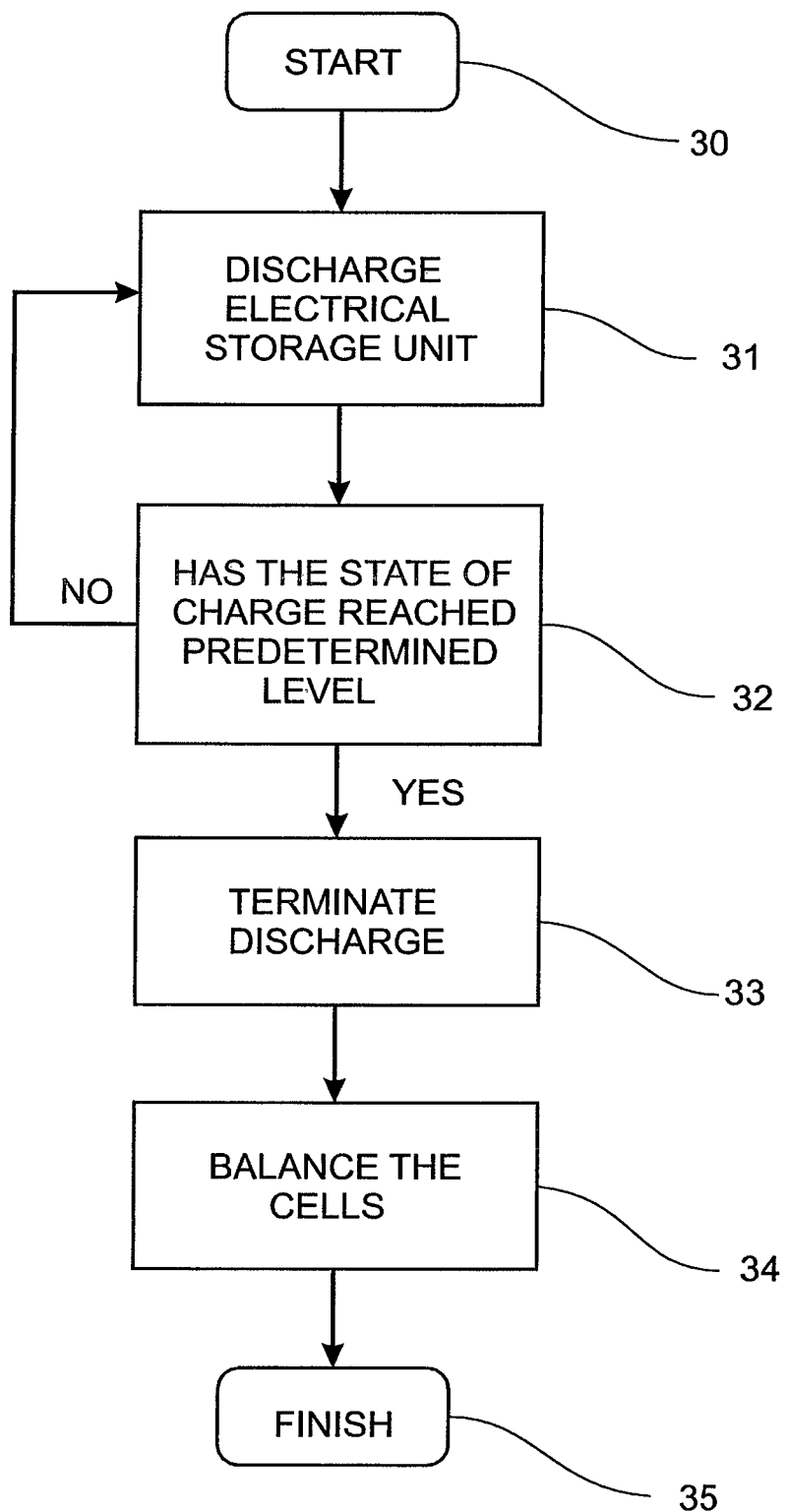
FIG. 3 shows an exemplary flow chart for carrying out the discharge step of the method according to the disclosure

The method for stressing the battery comprises the following steps:

Firstly, as shown in FIGS. 2 and 3, discharging 21 the battery down to the lower boundary of the SOC window.

Secondly, giving a discharge pulse 22, which will push the battery further down along the 15 output open circuit voltage/SOC characteristics, thus lower the battery SOC to fall within an estimation interval positioned below the first SOC level 11 but without permitting the battery to have a SOC level below a fourth SOC level 14 (FIG. 1), as this likely will result in the battery being permanently weakened and damaged.

Figure 4:
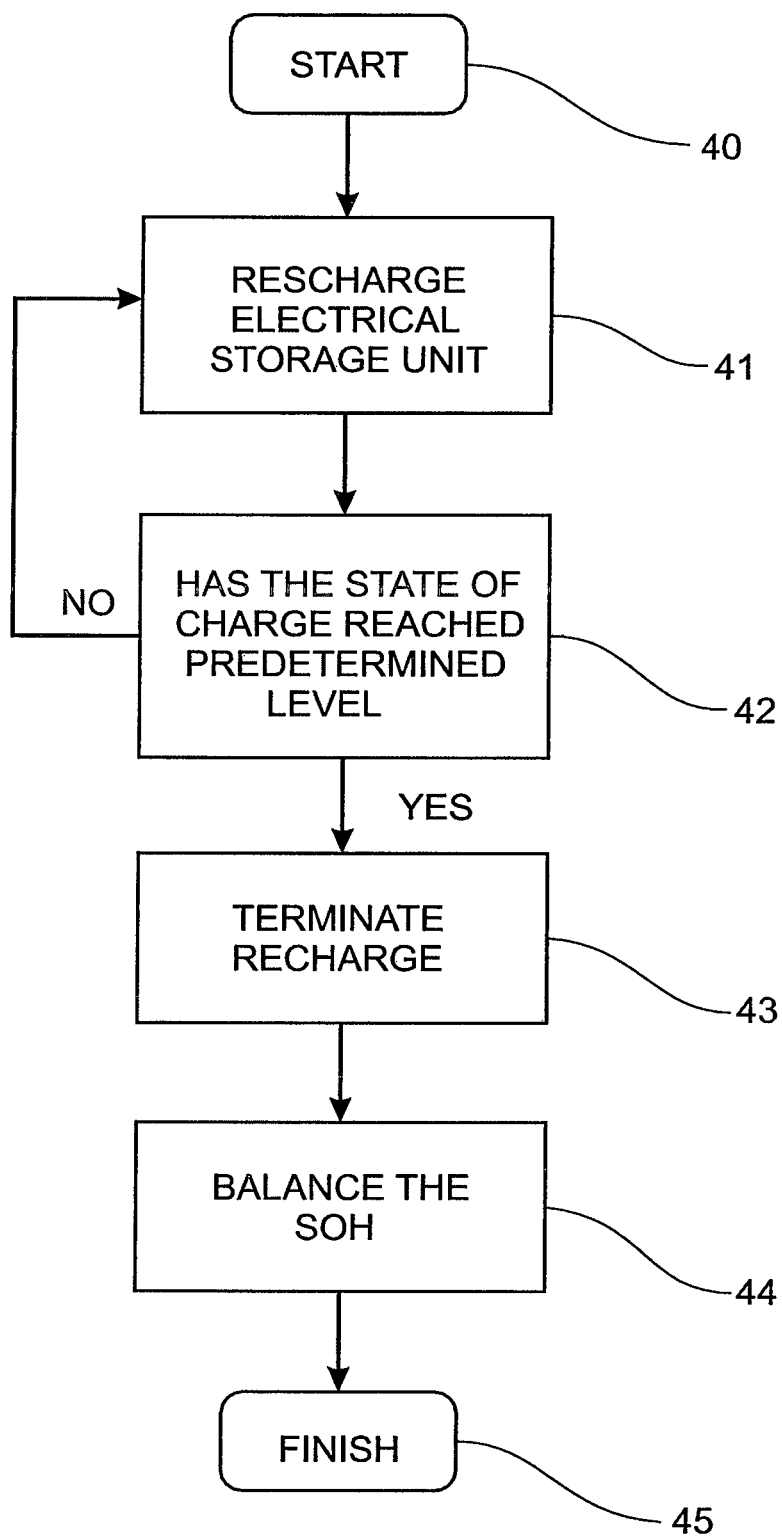
FIG. 4 shows an exemplary flow chart for carrying out the recharge step of the method according to the disclosure

Thirdly, as shown in FIGS. 2 and 4, charging 23 the battery to or even somewhat outside the 20 upper boundary of the SOC window, thus raise the battery SOC to fall within an estimation interval positioned above the second SOC level 12 (FIG. 1).

Fourthly, giving a stimulus of a charge pulse 24, which will push the battery further up atom; the output open circuit voltage/SOC characteristics.

According to the invention the determined present SOC window is compared with a standard 25 SOC window. The standard SOC window can, for instance, be a detected initial SOC window or a known original SOC window supplied by the manufacturer of the battery. The SOH characteristics of the battery can then be estimated by the outcome of the comparison between the determined present SOC window and the standard SOC window.

By studying the response and comparing it with a "known" characteristic response e.g. from component life tests, it is possible to judge the SOH of the battery. The above mentioned discharging and charging steps may be performed more than once, preferably three times as indicated in FIG. 2.

This leads to a better measurement resolution of the SOC, and thus to easier comparison of the SOC levels between different measurement occasions.

In one embodiment of the invention the charge current impulse is created by means of a combustion engine of the vehicle powering the electrical machine in generative operation.

In one embodiment of the invention the discharge currents impulse is created by the electric machine in a motoring operation driving a combustion engine of the vehicle.

In one embodiment of the invention method further comprising the step of:

connecting the battery of the vehicle to a charge pole, wherein the charge current pulse and the discharge current pulse is created by means of the charge pole.

In one embodiment of the invention the combustion engine is acting as a brake by its friction.

In one embodiment of the invention the combustion engine is acting as an engine retarder.

In one embodiment of the invention the method further comprises the step of calibrating the SOC window by using the estimated SOH characteristics.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

The foregoing has described the principles, preferred embodiments and modes of operation of the present invention. However, the invention should be regarded as illustrative rather than restrictive, and not as being limited to the particular embodiments discussed above. The different features of the various embodiments of the invention can be combined in other combinations than those explicitly described. It should therefore be appreciated that variations may be made in those embodiments by those skilled in the art without departing from the scope of the present invention as defined by the following claims.

The invention claimed is:

1. A method for estimation of State-of-health (SOH) characteristics of a battery in hybrid vehicles, comprising:
  charging and discharging the battery at least one time within an upper region of a State-of-charge (SOC) window, wherein the battery:
  i) is charged to a first predetermined level in the upper region of the SOC window during a first time period;
  ii) is charged by a first charge current impulse for pushing the SOC level of the battery to a level above the first predetermined level and outside the SOC window, during a second time period;
  iii) is discharged by an electrical machine to a second predetermined level within the SOC window;
  charging and discharging the battery at least one time within a lower region of the SOC window wherein the battery:
  i) is charged to a third predetermined level in the SOC window, during a third time period;
  ii) is discharged by an electrical machine to a fourth predetermined level in the SOC window;
  iii) is discharged by a second current impulse, for pushing the SOC level of the battery to a level below the fourth predetermined level and below the SOC window, during a fourth time period;
  calibrating a battery management unit comprised in the hybrid vehicle by using the reached levels outside the SOC window for determining correct upper and lower edges of the current soc window;
  estimating the SOH characteristics of the battery during the charge and discharge periods by using the battery management unit for determining the condition of the battery in comparison to a new and unused battery by comparing the current SOC window with a standard SOC window,
  wherein; the first and third time period is longer than the second and fourth time period respectively; and
  the first predetermined level represents a higher voltage, than the second predetermined level and the third predetermined level represents a higher voltage, than the fourth predetermined level.

2. The method according to claim 1, wherein the charge current impulse is created by means of a combustion engine of the vehicle powering the electrical machine in generative operation.

3. The method according to claim 1, wherein the discharge currents impulse is created by the electric machine in a motoring operation driving a combustion engine of the vehicle.

4. The method according to claim 1, further comprising the step of:
  a. connecting the battery of the vehicle to a charge pole, wherein the charge current pulse and the discharge current pulse is created by means of the charge pole.

5. The method according to claim 3, wherein the combustion engine acts as a brake by its friction.

6. The method according to claim 3, wherein the combustion engine acts as an engine retarder.

7. The method according to claim 1, wherein the method further comprises the step of:
  a. calibrating the SOC window by using the estimated SOH characteristics.

* * * * *